United States Patent
Nihei et al.

(10) Patent No.: US 7,786,487 B2
(45) Date of Patent: Aug. 31, 2010

(54) SEMICONDUCTOR DEVICE AND MANUFACTURING METHOD THEREOF

(75) Inventors: Mizuhisa Nihei, Kawasaki (JP); Masahiro Horibe, Kawasaki (JP); Yuji Awano, Kawasaki (JP); Kazukiyo Joshin, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 241 days.

(21) Appl. No.: 10/796,146

(22) Filed: Mar. 10, 2004

(65) Prior Publication Data

US 2005/0067693 A1    Mar. 31, 2005

(30) Foreign Application Priority Data

Sep. 30, 2003  (JP) .............. 2003-340404

(51) Int. Cl.
*H01L 31/0312* (2006.01)
(52) U.S. Cl. .......... 257/77; 257/276; 257/720; 257/E23.074; 257/E23.11
(58) Field of Classification Search ........ 257/276, 257/625, 77, 718, 720, E51.04, E23.074, 257/E23.11
See application file for complete search history.

(56) References Cited

U.S. PATENT DOCUMENTS 5,438,212 A    8/1995  Okaniwa
5,770,513 A    6/1998  Okaniwa (Continued)

FOREIGN PATENT DOCUMENTS

| JP | 5-29357 | 2/1993 |
|----|---------|--------|
| JP | 6-310547 | 11/1994 |
| JP | 7-321343 | 12/1995 |
| JP | 10-265208 | 10/1998 |
| JP | 2000-31462 | 1/2000 |
| JP | 2001-267589 | 9/2001 |
| JP | 2002-329723 | 11/2002 |
| JP | 2003-100658 | 4/2003 |

OTHER PUBLICATIONS

P.P. Ruden, et al.; "Extrinsic Performance Limitations of AlGaN/GaN Heterostructure Field Effect Transistors"; *MRS Internet J. Nitride Semicond. Res.*; 4S1, G6.35; 1999 (6 pages.)/Discussed in the specification.
P. Kim, et al.; "Thermal Transport Measurements of Individual Multiwalled Nanotubes"; *Physical Review Letters 87*; 215502; Nov. 19, 2001./Discussed in the specification.
M. Kusunoki, et al.; A formation mechanism of carbon nanotube films on SiC(0001); *Applied Physics Letters*; vol. 77; Issue 4; Jul. 24, 2000; p. 531./Discussed in the specification.
Japanese Office Action dated Apr. 7, 2009 with its partial English translation.

*Primary Examiner*—Thanhha Pham
(74) *Attorney, Agent, or Firm*—Kratz, Quintos & Hanson, LLP

(57) ABSTRACT

Disclosed is a semiconductor device including a SiC substrate and a heat conductor formed in a hole in the SiC substrate and made of a linear structure of carbon elements.

8 Claims, 18 Drawing Sheets d2 > d1

U.S. PATENT DOCUMENTS

| | | | |
|---|---|---|---|
| 6,191,478 B1 * | 2/2001 | Chen | 257/718 |
| 6,278,231 B1 | 8/2001 | Iwasaki et al. | |
| 6,303,094 B1 | 10/2001 | Kusunoki et al. | |
| 6,445,006 B1 * | 9/2002 | Brandes et al. | 257/76 |
| 6,628,053 B1 * | 9/2003 | Den et al. | 313/310 |
| 7,084,507 B2 | 8/2006 | Awano | |
| 2005/0006754 A1 * | 1/2005 | Arik et al. | 257/712 |
| 2006/0091532 A1 * | 5/2006 | Sung | 257/720 |

* cited by examiner

First Heat Treatment

Second Heat Treatment d2 > d1

Second Heat Treatment

SEMICONDUCTOR DEVICE AND MANUFACTURING METHOD THEREOF

CROSS-REFERENCE TO RELATED APPLICATIONS

This application is based upon and claims priority of Japanese Patent Application No. 2003-340404, filed on Sep. 30, 2003, the contents being incorporated herein by reference.

BACKGROUND OF THE INVENTION

1. Field of the Invention

The present invention relates to a semiconductor device and a manufacturing method thereof. More specifically, the present invention relates to a semiconductor device capable of enhancing a heat radiation effect from a substrate and to a manufacturing method thereof.

2. Description of the Related Art

In recent years, a high electron mobility transistor (HEMT) has been widespread as a low noise amplifying element. The HEMT is constructed by forming a channel layer, a spacer layer and an electron supply layer in this order on a semiconductor substrate. A flow of a two dimensional electron gas (2DEG) formed on an interface between the channel layer and the spacer layer is controlled by an electric field from a gate electrode, and thus a current amount between a source and a drain is controlled.

There are some types in the HEMT in accordance with compositions of respective semiconductor layers constituting the HEMT. Among them, an AlGaN/GaN heterojunction HEMT including a GaN channel layer and an AlGaN spacer layer is suitable for a high power operation. However, as shown in FIG. 7 of Non-Patent Document 1, in the AlGaN/GaN heterojunction HEMT, when the high power operation is performed, the current amount is reduced due to heat generation of the element, causing a disadvantage in that sufficient element characteristics cannot be obtained. Accordingly, it is essential to take effective solution for this heat radiation problem.

Note that technologies relating to the present invention are also disclosed in Patent Document 1, Patent Document 2, Non-Patent Document 2, and Non-Patent Document 3.

(Patent Document 1)
Japanese Patent Laid-Open No. Hei 10 (1998)-265208
(Patent Document 2)
Japanese Patent Laid-Open No. 2000-31462
(Non-Patent Document 1)
P. P. Ruden, et al., MRS Internet J. Nitride Semicond. Res. 4S1, G6.35 (1999)
(Non-Patent Document 2)
P. Kim, et al., Phys. Rev Lett. 87 (2001) 215502
(Non-Patent Document 3)
M. Kusunoki, et al., Appl. Phys. Lett., 77 (2000) 531

The above-described heat generation is seen not only in a compound semiconductor such as the AlGaN/GaN heterojunction HEMT but also in a silicon-based semiconductor device. It is necessary to find the solution for semiconductor devices in general.

SUMMARY OF THE INVENTION

According to a first aspect of the present invention, a SiC substrate more excellent in thermal conductivity than a silicon substrate is used, and a heat conductor is made of carbon nanotubes (a linear structure of carbon elements) extremely high in thermal conductivity. Accordingly, heat generated in the element on the SiC substrate is rapidly radiated from the SiC substrate and the heat conductor, and a temperature increase of the element can be prevented, thus making it possible to sufficiently bring out characteristics of the element.

In this case, when a film is formed on the SiC substrate, a hole is formed in this film on the heat conductor, and an electrode directly connected to the heat conductor is provided in the hole, it becomes easy for the heat generated in the element to escape to the heat conductor through the electrode, thus making it further easier to prevent the temperature increase of the element.

Furthermore, as the lowermost layer of the electrode, a titanium layer having a small contact resistance to the carbon nanotubes is employed, thus making it possible to reduce power consumption on an interface between the heat conductor and the electrode.

In addition, a conductive film electrically connected to the above-described heat conductor is formed on the entire surface of the SiC substrate, which is opposite to the above-described film, thus making it easy for the heat passing through the heat conductor to escape from the entire surface of the SiC substrate.

Moreover, a protective film is formed between the above-described film and SiC substrate. Thus, impurities can be prevented from being mixed from the heat conductor into the film, the heat conductor can be prevented from being deteriorated when forming the film, and a high-quality semiconductor device can be provided.

Particularly, a film whose lattice constant is a value between respective lattice constants of the SiC substrate and the above-described film is formed as the protective film. Thus, a mismatch in lattice constant between the film and the protective film is reduced, and it becomes difficult for a lattice defect to enter the film.

Then, according to a second aspect of the present invention, a first heat conductor and a second heat conductor are provided in the SiC substrate, and accordingly, a heat radiation effect can be enhanced more in comparison with the case where only one heat conductor is present.

Furthermore, a distance from the other surface of the SiC substrate to an upper surface of the second heat conductor is elongated more than a distance from the other surface of the SiC substrate to an upper surface of the first heat conductor. Thus, a leakage current between the element and the second heat conductor can be reduced.

Particularly, in the case of forming a HEMT as the element, when at least a part of the second heat conductor is located between a gate electrode and a drain electrode of the HEMT, where an electric field concentrates and an amount of heat generation increases, when viewed from above the SiC substrate, heat generated in the HEMT can be picked up efficiently by the second heat conductor, and the heat radiation effect can be enhanced.

Meanwhile, according to a third aspect of the present invention, the second heat conductor is formed on the entire surface of the SiC substrate, and accordingly, the heat generated in the element can be radiated from the entire surface of the SiC substrate, and the heat radiation effect is further enhanced.

Then, according to a fourth embodiment of the present invention, carbon nanotubes are selectively grown from the surface of the SiC substrate exposed from a mask film by performing a heat treatment for the SiC substrate, and the carbon nanotubes are made into a heat conductor. Accordingly, it is not necessary to previously form a hole for embedding the heat conductor in the SiC substrate difficult to be etched, and the heat conductor can be formed easily without bringing about complicatedness of the process.

In this case, it is preferable not to grow the carbon nanotubes until penetrating the SiC substrate but to form a film on the other surface of the SiC substrate after stopping the growth of the carbon nanotubes at midpoint depth of the SiC substrate. According to this, the carbon nanotubes, which is a different type of material from SiC, are not exposed on the other surface of the SiC substrate, and accordingly, it becomes difficult for a lattice defect to enter the film to be formed.

Furthermore, a heat treatment for growing the carbon nanotubes is performed before forming the element on the SiC substrate. Accordingly, the element can be prevented from being damaged by the heat treatment.

Meanwhile, according to a fifth embodiment of the present invention, the first heat conductor and the second heat conductor are formed in the SiC substrate by performing a first heat treatment and a second heat treatment separately. Accordingly, a semiconductor substrate, whose heat radiation effect is enhanced by these heat conductors, can be provided.

Moreover, according to a sixth aspect of the present invention, the carbon nanotubes are grown from the entire surface of the SiC substrate to a depth direction of the substrate. Accordingly, ultimate thickness of the SiC substrate is thinned more than that before the heat treatment, and it becomes difficult for the heat to be accumulated in the SiC substrate, thus making it possible to sufficiently bring out the element characteristics of the element.

Then, according to a seventh aspect of the present invention, the heat conductor made of the carbon nanotubes is formed from the surface of the SiC substrate to midpoint depth of the substrate by a heat treatment, and then the SiC substrate is polished from the other surface to expose the surface of the heat conductor. According to this, since the thickness of the SiC substrate is thinned by the polishing, it can be made difficult for the heat to be accumulated in the SiC substrate.

Furthermore, the protective film may be formed on the heat conductor exposed on the surface of the SiC substrate, and another film may be formed on this protective film. In this case, the film formed on the protective film is formed by a MOCVD method of enhanced lateral overgrowth. Thus, it becomes difficult for the lattice defect to enter the film.

Furthermore, according to an eighth aspect of the present invention, the carbon nanotubes are grown in a hole of a semiconductor substrate to be made into the heat conductor, and then a surface of the semiconductor substrate, which is opposite to a surface having the hole, is polished to expose the heat conductor. Accordingly, the thickness of the semiconductor substrate is thinned, and similarly to the sixth aspect, it can be made difficult for the heat to be accumulated in the substrate.

DETAILED DESCRIPTION OF THE PREFERRED EMBODIMENTS

The best mode for carrying out the present invention will be described below in detail with reference to the accompanying drawings.

First Embodiment

FIGS. 1A to 1G are cross-sectional views showing a method of manufacturing a semiconductor device according to a first embodiment of the present invention in order of processes.

In this embodiment, an AlGaN/GaN heterojunction HEMT is fabricated as an example of the semiconductor device.

Figure 1A:
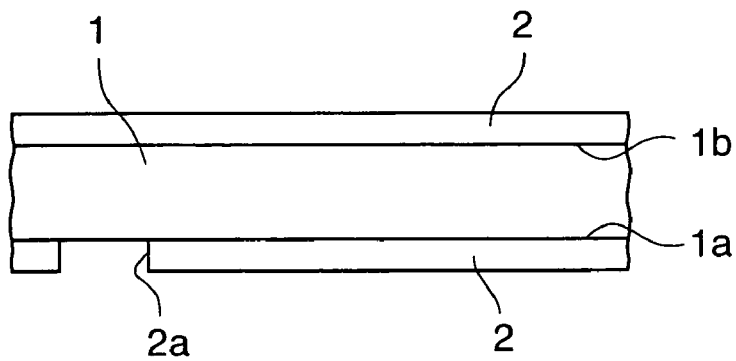
FIGS. 1A to 1G are cross-sectional views showing a method of manufacturing a semiconductor device according to a first embodiment of the present invention in order of processes.

First, a process until obtaining a cross-sectional structure shown in FIG. 1A will be described.

First, silicon nitride films are formed as a mask film 2 to a thickness of approximately 500 nm by a plasma CVD method on a surface 1a and the other surface 1b of a SiC substrate 1 whose thickness is thinned to approximately 100 μm. Thereafter, a resist pattern (not shown) is formed on one of the mask films 2. While using the resist pattern as a mask, the mask film 2 on the surface 1a of the SiC substrate 1 is etched by dry etching using a fluorine-based etching gas such as $SF_6$ gas, thus forming a window 2a. After that, the resist pattern is removed.

Figure 1B:
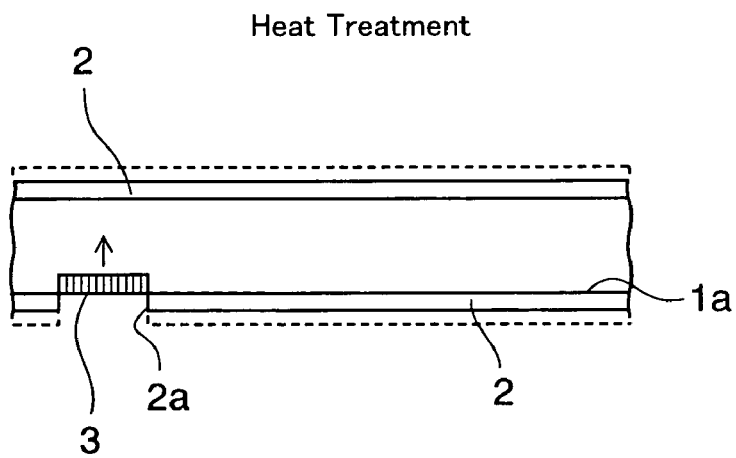

Subsequently, as shown in FIG. 1B, the SiC substrate 1 is placed in an oxygen atmosphere or in a vacuum at a pressure of approximately $10^{-4}$ to $10^{-10}$ Torr, and a heat treatment for the SiC substrate 1 is started at a substrate temperature of 1200 to 2000° C., and preferably, 1500 to 1700° C. Thus, silicon elements, exposed to an inside of the window 2a, are removed from the SiC substrate 1, and remaining carbon elements are oriented to a depth direction of the SiC substrate 1 and become a bundle of carbon nanotubes (a linear structure of carbon) 3. This bundle of carbon nanotubes 3 is constructed by collecting several hundreds to thousands of cylindrical carbon nanotubes whose diameter is approximately 1 nm, and formed toward an inside of the SiC substrate 1 in a self-aligning manner with the window 2a. Particularly, when employing the SiC substrate 1 whose surface 1a is an a-SiC (000-1) C plane, it becomes easy for the respective carbon nanotubes to grow toward the depth direction of the SiC substrate, and accordingly, the bundle of carbon nanotubes 3 of high quality can be obtained.

Note that the carbon nanotubes do not grow on the surface 1b covered with the mask film 2. Moreover, during the heat treatment, the mask films 2 are also decomposed, and a film thickness thereof is gradually reduced. Such a growth method of the carbon nanotubes is also referred to as a SiC surface decomposition method.

Figure 1C:
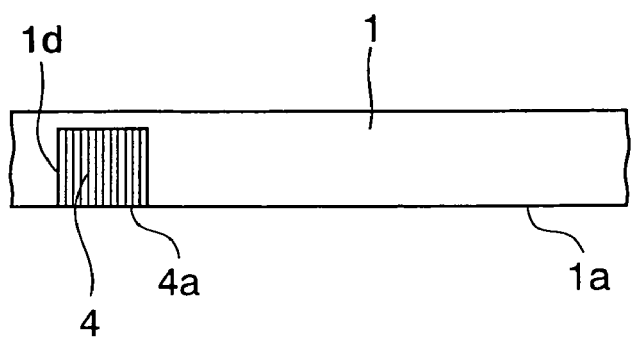

Then, as shown in FIG. 1C, the above-described heat treatment is stopped before the bundle of carbon nanotubes 3 penetrates the SiC substrate 1, and the obtained bundle of carbon nanotubes 3 is employed as a heat conductor 4. In this case, it is preferable that the mask films 2 disappear simultaneously with the stop of the heat treatment. However, even when the mask films 2 remain on the SiC substrate 1, the mask films 2 can be removed by use of a hydrofluoric acid solution. Moreover, though amorphous carbon and the like are adhered onto portions of the SiC substrate 1, where the mask films 2 were formed, this amorphous silicon can also be removed by such an acid treatment using the hydrofluoric acid solution.

By the process until here, a structure, in which the heat conductor 4 constructed from the carbon nanotubes is embedded into a hole 1d of the SiC substrate 1, is obtained. Since the heat conductor 4 is formed as a result that silicon falls from the SiC substrate 1, a height of an end surface 4a becomes equal to that of the surface 1a of the SiC substrate 1.

Figure 1D:
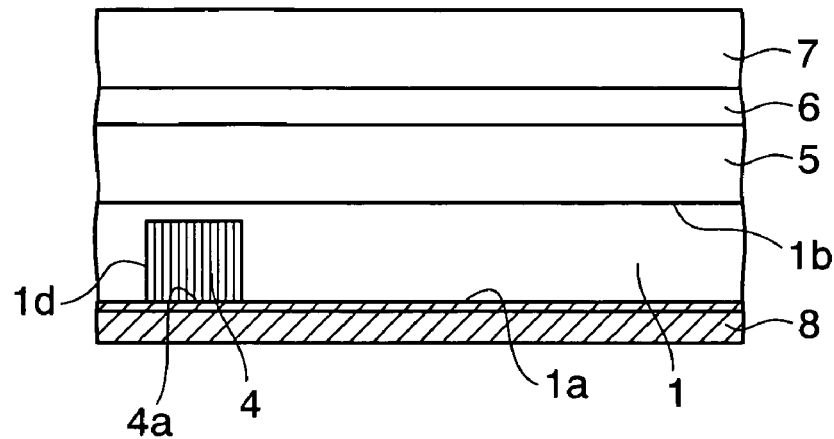

Next, a process until obtaining a cross-sectional structure shown in FIG. 1D will be described.

First, a titanium (Ti) layer with a thickness of 10 nm and a gold (Au) layer with a thickness of 500 nm are formed in this order on the surface 1a of the SiC substrate 1 and the end surface 4a of the heat conductor 4 by a sputtering method, and a ground electrode 8 constructed from these conductive films are formed. This ground electrode 8 is formed on the whole of the surface 1a of the SiC substrate 1, and electrically connected to the heat conductor 4.

Thereafter, on the surface 1b of the SiC substrate 1, which is opposite to the ground electrode 8, an i-type GaN film with a thickness of approximately 3 μm is formed as a channel layer 5 by a metal organic CVD (MOCVD) method. In this MOCVD method, trimethylgallium (TMGa) and $NH_3$ are used as a Ga source and an N source, respectively, and growth conditions where a growth pressure is 20 Torr and a substrate temperature is 1000° C. are employed.

Subsequently, i-type AlGaN is formed as a space layer 6 to a thickness of approximately 10 nm on the channel layer 5 by use of the MOCVD method using TMGa, $NH_3$ and trimethylaluminium (TMAl) as reaction gases under the conditions where the growth pressure is 20 Torr and the substrate temperature is 1000° C.

Furthermore, n-type AlGaN is formed as an electron supply layer 7 to a thickness of approximately 10 nm by a MOCVD method. In this MOCVD method, a gas obtained by adding Si as a source of an n-type impurity to the reaction gases used when forming the spacer layer 6 is used, and the conditions, where the growth pressure is 20 Torr and the substrate temperature is 1000° C., is employed.

Note that the respective layers 5 to 7 may be formed by a molecular beam epitaxy (MBE) method.

Figure 1E:
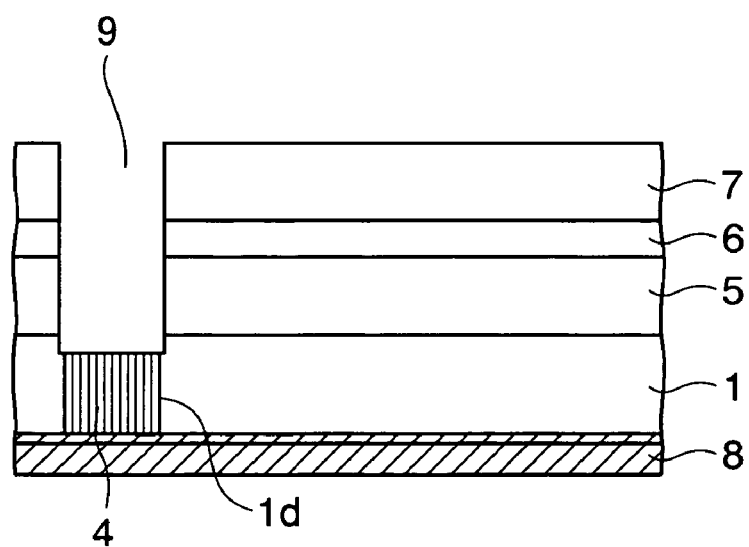

Subsequently, as shown in FIG. 1E, a resist pattern (not shown) including a hole-shaped window is formed on the electron supply layer 7, and while using this resist pattern as an etching mask, etching is performed from the electron supply layer 7 to the SiC substrate 1 by plasma etching using a chlorine-based gas such as $BCl_3$ gas. Thus, a hole 9 with a depth reaching the heat conductor 4 is formed. Thereafter, the resist pattern is removed.

Figure 1F:
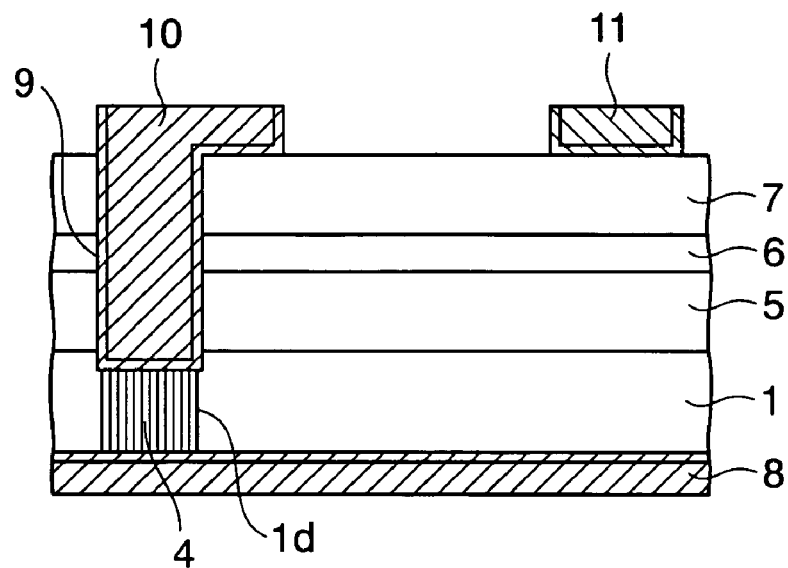

Next, a process until obtaining a cross-sectional structure shown in FIG. 1F will be described.

First, a resist pattern (not shown) including a window with a shape of a source electrode and a window with a shape of a drain electrode is formed on the electron supply layer 7. Then, a Ti layer with a thickness of 10 nm and an Au layer with a thickness of 300 nm are formed by an evaporation method on an upper surface of the resist pattern and into the windows. This metal stack film is also formed in the hole 9 through the window with the shape of the source electrode in the resist pattern. Thereafter, the resist pattern is removed, and the metal stack film is patterned by a lift-off method to be left as a source electrode 10 and a drain electrode 11 on the electron supply layer 7. The source electrode 10 is directly connected to the heat conductor 4 at a bottom portion of the hole 9, and is electrically connected to the ground electrode 8 through the heat conductor 4.

Figure 1G:
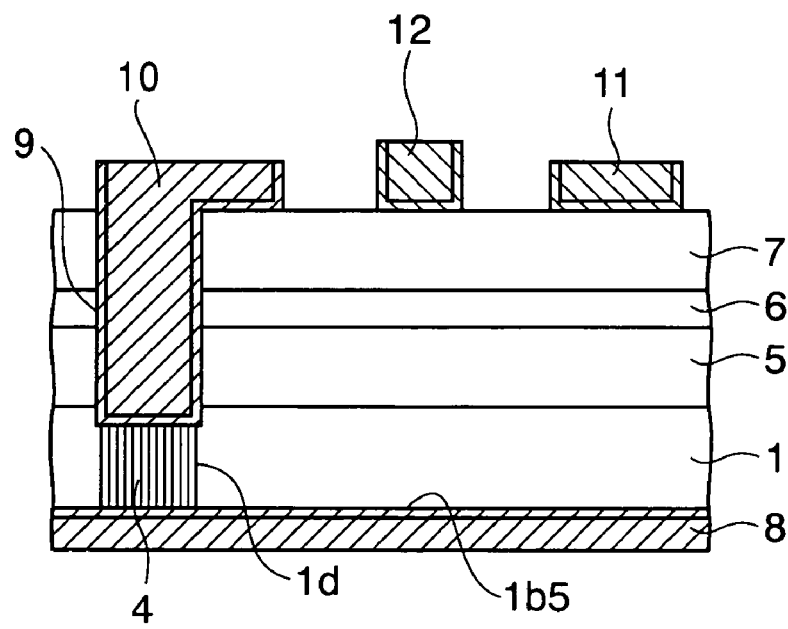

Thereafter, as shown in FIG. 1G, a gate electrode 12 constructed by forming a platinum (Pt) layer with a thickness of 10 nm and an Au layer with a thickness of 30 nm in this order is formed by the evaporation method and the lift-off method.

Figure 2:
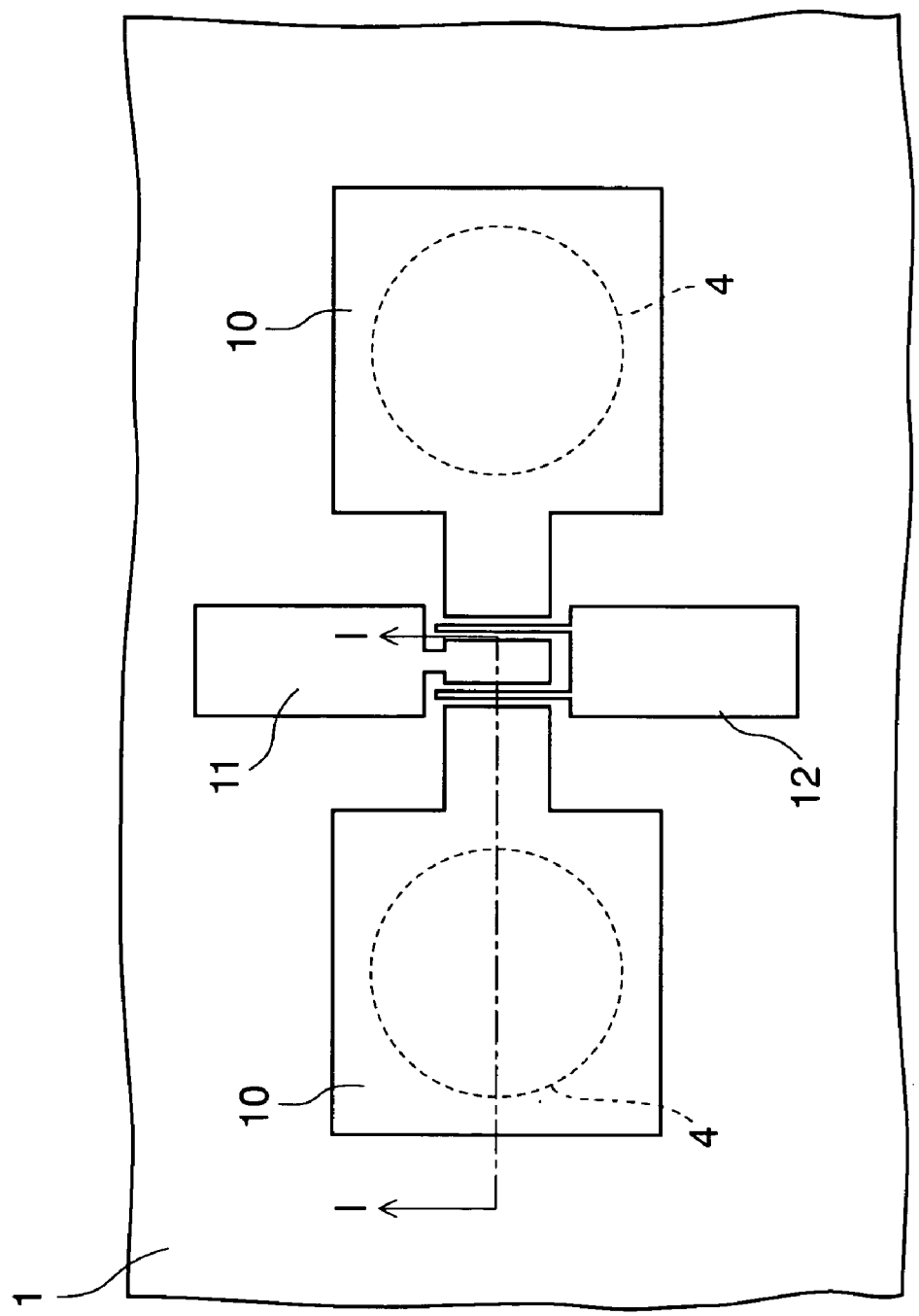
FIG. 2 is a plan view showing the method of manufacturing a semiconductor device according to the first embodiment of the present invention.

A plan view after an end of the processes until here becomes as shown in FIG. 2, and FIG. 1G explained in the above corresponds to a cross-sectional view along a line I-I of FIG. 2.

In a plane layout shown in FIG. 2, two source electrodes 10 are formed in one active region, and one drain electrode 11 is common to the respective source electrodes 10.

By the above steps, a basic structure of the HEMT according to the present embodiment is completed.

According to the above-described embodiment, the carbon nanotubes are employed as a material constituting the heat conductor 4. As described in Non-Patent Document 2, a thermal conductivity of the carbon nanotubes is 30 W/(cm·K) or more. This value is vastly larger than a thermal conductivity (approximately 4.9 W/(cm·K)) of SiC crystal. Therefore, heat generated in the HEMT is rapidly radiated through the heat conductor 4 toward the surface 1a of the SiC substrate 1, thus making it possible to reduce a temperature increase in the HEMT, which is involved in a high power operation. Accordingly, a reduction of a current amount due to the temperature increase can be prevented, and it is made possible to sufficiently bring out characteristics of the HEMT.

In addition, the SiC substrate 1 whose thermal conductivity is approximately three times as large as that of a silicon substrate is used. Accordingly, in comparison with the case of fabricating the HEMT on the silicon substrate, the heat generated in the HEMT can be efficiently radiated toward the back surface 1a of the SiC substrate 1.

Furthermore, the carbon nanotubes constituting the heat conductor 4 is formed by decomposing the surface of the SiC substrate 1 through the window 2a (see FIG. 1B) of the mask film 2. Accordingly, the heat conductor 4 can easily be formed in the SiC substrate 1 without previously forming a hole for forming the heat conductor 4 in the SiC substrate 1 difficult to be etched, and simplification of the process can be achieved.

The carbon nanotubes are made to stop growing at some midpoint depth of the SiC substrate 1. Accordingly, the heat conductor 4 made of a different type of material from SiC is not exposed to the other surface 1b of the SiC substrate 1. Consequently, only SiC appears on the whole of the surface 1b, and the different type of material does not appear on the surface 1b. Therefore, a lattice defect resulting from a difference in lattice constant between different type of materials becomes difficult to enter the channel layer 5 formed on the surface 1b.

Then, the heat conductor 4 is formed before fabricating a semiconductor device such as the HEMT. Accordingly, the HEMT can be prevented from being damaged by the heat treatment for growing the carbon nanotubes.

Moreover, the source electrode 10 is formed in the hole 9, and the source electrode 10 is directly connected to the heat conductor 4 at the bottom portion of the hole 9. Accordingly, the heat generated in the HEMT becomes easy to escape to the heat conductor 4 through the source electrode 10 which is made of metal and has a high thermal conductivity, and it becomes further easier to prevent the temperature increase in the HEMT.

The heat is radiated far more effectively by the ground electrode 8 formed over the surface 1a of the SiC substrate 1.

In addition, the Ti layer, whose contact resistance to the carbon nanotubes is small, is employed as the lowermost layer of the source electrode 10. Accordingly, electric power can be prevented from being wastefully consumed on an interface between the heat conductor 4 and the source electrode 10.

Note that, though the HEMT is formed as the semiconductor device in the above description, the present invention is not limited to this, and a semiconductor device such as a GaN-based LED may be formed. This is also the case for the following respective embodiments.

Second Embodiment

FIGS. 3A to 3D are cross-sectional views showing a method of manufacturing a semiconductor device according to a second embodiment of the present invention in order of processes. In these drawings, the same reference numerals as those in the first embodiment will be used to the members described in the first embodiment, and description thereof will be omitted below.

Figure 3A:
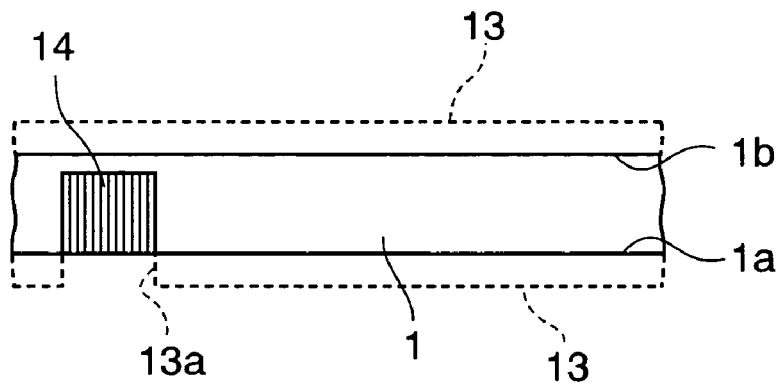
FIGS. 3A to 3D are cross-sectional views showing a method of manufacturing a semiconductor device according to a second embodiment of the present invention in order of processes.

First, a process until obtaining a cross-sectional structure shown in FIG. 3A will be described.

First, the deposition method of the mask films 2, which has been described in the first embodiment, is employed, and silicon nitride films as first mask films 13 are formed to a thickness of approximately 500 nm by a CVD method on the respective surfaces 1a and 1b of the SiC substrate 1. Thereafter, a first window 13a is formed in the first mask film 13 on the surface 1a of the SiC substrate 1.

After that, a first heat treatment in which a substrate temperature is maintained at 1200 to 2000° C., and preferably, 1500 to 1700° C. in the oxygen atmosphere or in the vacuum at the pressure of approximately $10^{-4}$ to $10^{-10}$ Torr is performed. Thus, a first conductor 14 constructed from carbon nanotubes is formed from the surface of the SiC substrate 1 to an inside thereof in a self-aligning manner with the first window 13a, and the first mask film 13 disappears.

Figure 3B:
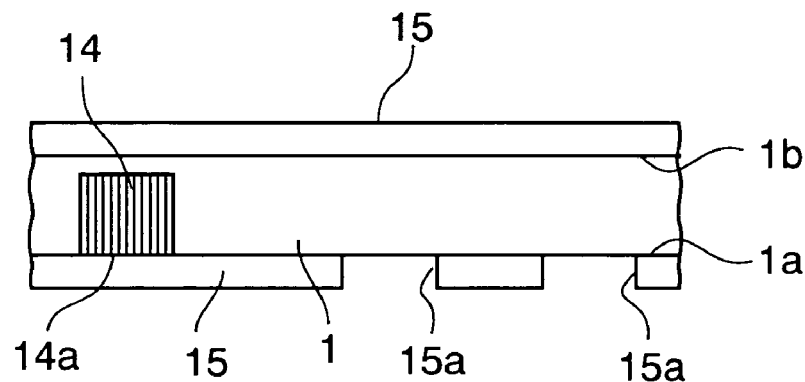

Next, a process until obtaining a cross-sectional structure shown in FIG. 3B will be described.

First, silicon nitride films are formed as a second mask film 15 to a thickness of 500 nm on the respective surfaces 1a and 1b of the SiC substrate 1 including an end surface 14a of the first heat conductor 14 by a plasma CVD method. Thereafter, a resist pattern (not shown) is formed on the second mask film 15 on the surface 1a, and while using this resist pattern as an etching mask, the second mask film 15 is etched by dry etching using the fluorine-based etching gas such as $SF_6$ gas, and second window 15a is formed to be spaced from the first heat conductor 14 at intervals. Thereafter, the resist pattern is removed.

Figure 3C:
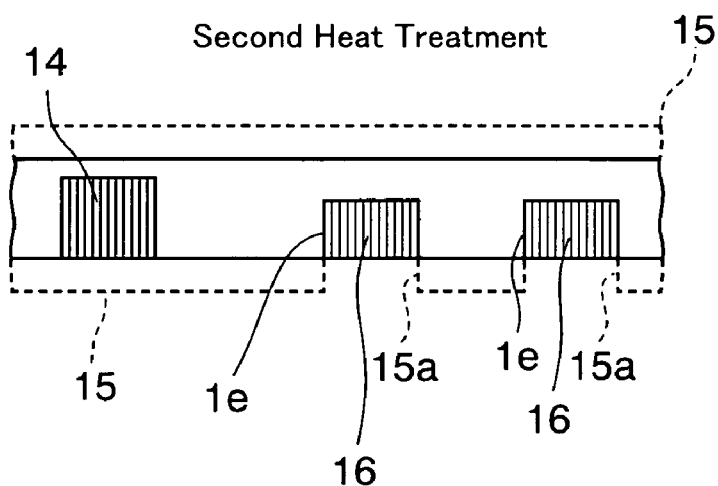

Subsequently, as shown in FIG. 3C, a second heat treatment employing the substrate temperature of 1200 to 2000° C., and preferably, 1500 to 1700° C. in the oxygen atmosphere or in the vacuum at the pressure of approximately $10^{-4}$ to $10^{-10}$ Torr is performed for the SiC substrate 1, and surface decomposition for SiC is started. Consequently, carbon nanotubes grow in the SiC substrate 1 in a self-aligning manner with the second windows 15a. Then, the second heat treatment is ended before the carbon nanotubes grow longer than those of the first conductor 14, and the obtained carbon nanotubes are used as second heat conductors 16. Thus, a structure in which the second heat conductors 16 are formed in hole 1e of the SiC substrate 1 is obtained.

Note that the second mask films 15 are decomposed with the growth of the carbon nanotubes, and disappear at the time when the second heat treatment is ended.

Figure 3D:
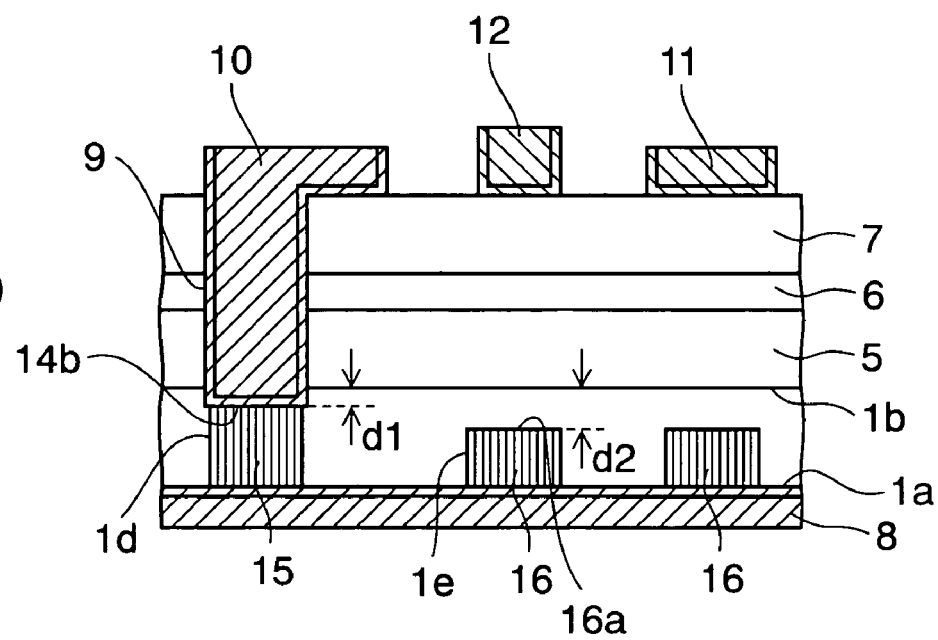

Thereafter, the processes of FIGS. 1D to 1G, which have been described in the first embodiment, are performed, and a basic structure of an HEMT shown in FIG. 3D is completed. According to this structure, similarly to the first embodiment, the first heat conductor 14 is embedded in the hole 1d of the SiC substrate 1, and the source electrode 10 in the hole 9 is electrically connected to the first heat conductor 14.

Figure 4:
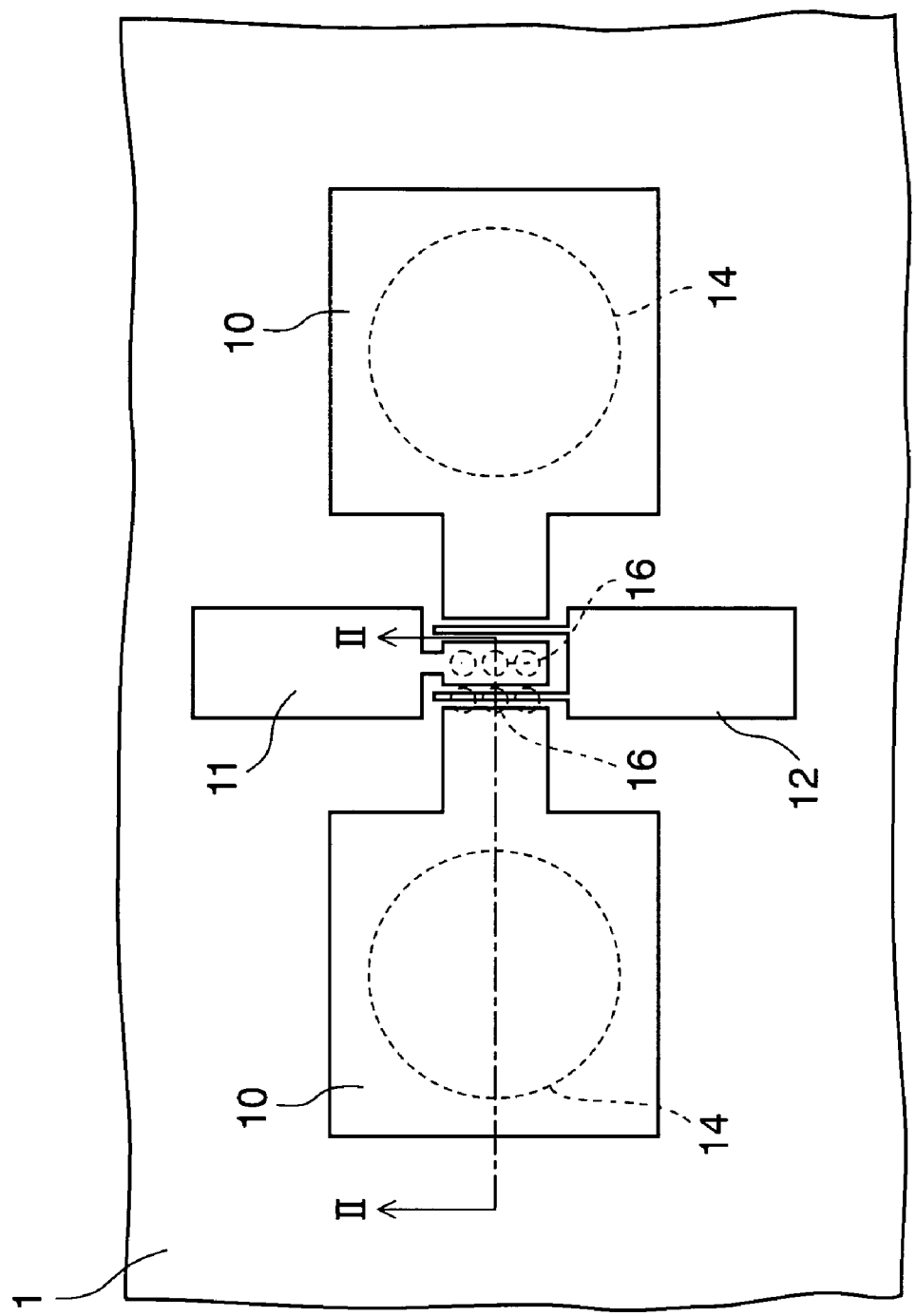
FIG. 4 is a plan view showing the method of manufacturing a semiconductor device according to the second embodiment of the present invention.

A plan view after the end of this process becomes is as shown in FIG. 4, and FIG. 3 explained in the above corresponds to a cross-sectional view along a line II-II of FIG. 4.

As shown in FIG. 4, the second heat conductors 16 are formed such that at least a part thereof is located between the gate electrode 12 and the drain electrode 11.

According to this embodiment described above, as shown in FIG. 3D, the second heat conductors 16 are also formed as well as the first conductor 14. Accordingly, heat generated in the HEMT is radiated toward the surface 1a of the SiC substrate 1 through both of the first heat conductor 14 and the second heat conductors 16, and the heat radiation can be performed more effectively in comparison with the first embodiment.

Furthermore, at least a part of the second heat conductor 16 is arranged between the gate electrode 12 and the drain electrode 11, where an electric field is concentrated to increase a heat generation amount. Thus, the generated heat can be picked up efficiently by the second heat conductor 16, and a heat radiation effect can be enhanced.

In addition, a distance d2 from the surface 1b of the SiC substrate 1 to an upper surface 16a of the second heat conductors 16 is elongated more than a distance d1 from the surface 1b to an upper surface 14b of the first heat conductor 14. Accordingly, it becomes difficult for a two dimensional electron gas in the channel layer 5 to flow into the second heat conductor 16. Consequently, a high-quality HEMT in which a leakage current between the two dimensional electron gas and the second heat conductor 16 is reduced can be provided.

Figure 5:
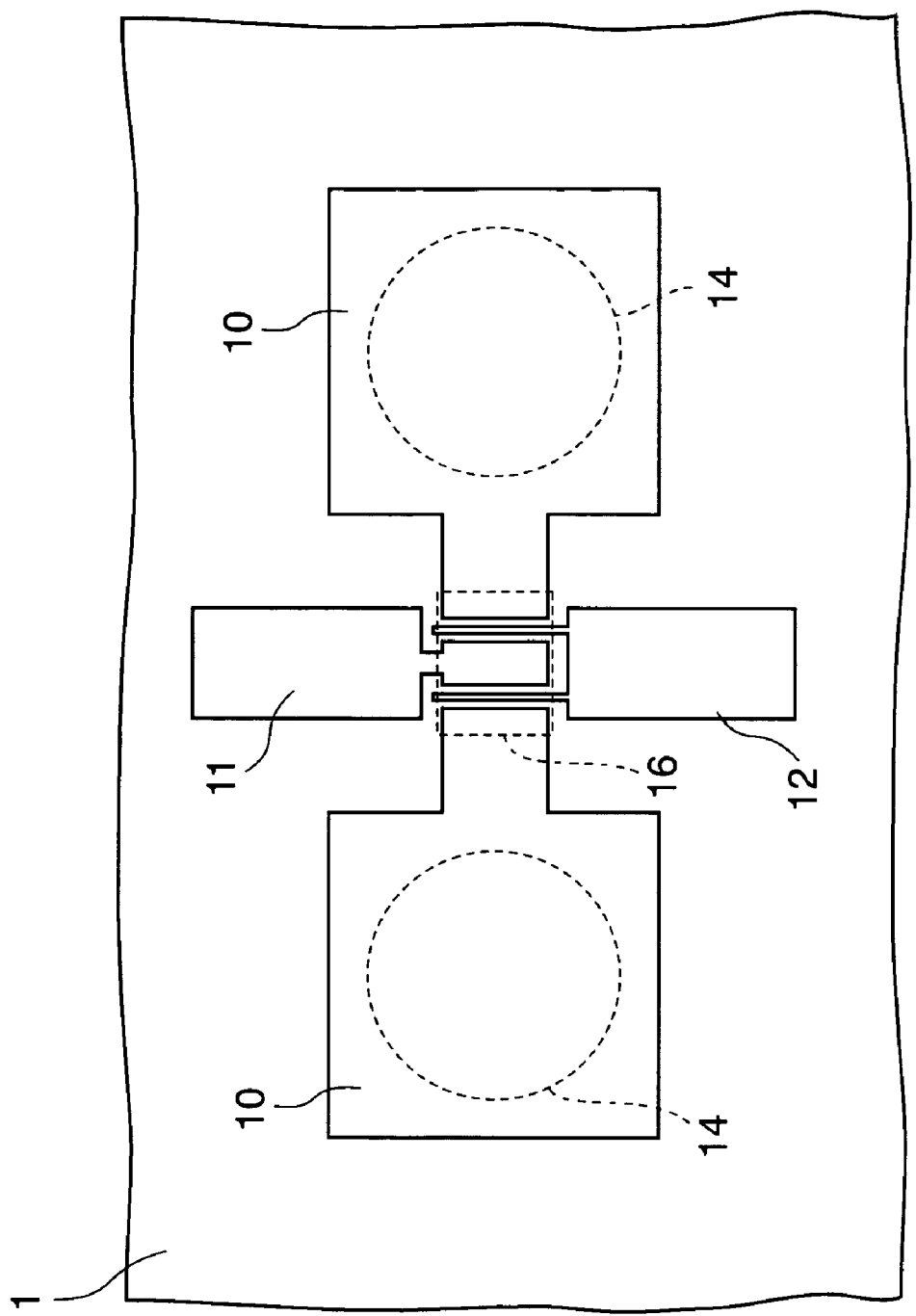
FIG. 5 is a plan view showing another example of the semiconductor device according to the second embodiment of the present invention.

Note that a plane layout of the present embodiment is not limited to that in FIG. 4, and as shown in FIG. 5, the second heat conductor 16 may be formed in such a rectangular hole commonly straddling the source electrode 10, the gate electrode 12 and the drain electrode 11.

Third Embodiment

Figure 6A:
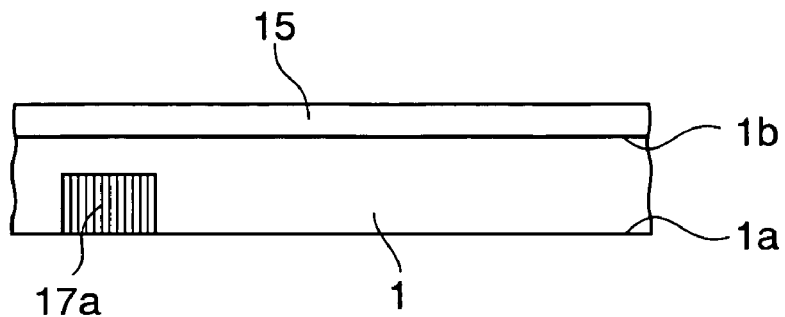
FIGS. 6A to 6C are cross-sectional views showing a method of manufacturing a semiconductor device according to a third embodiment of the present invention in order of processes.
Figure 6B:
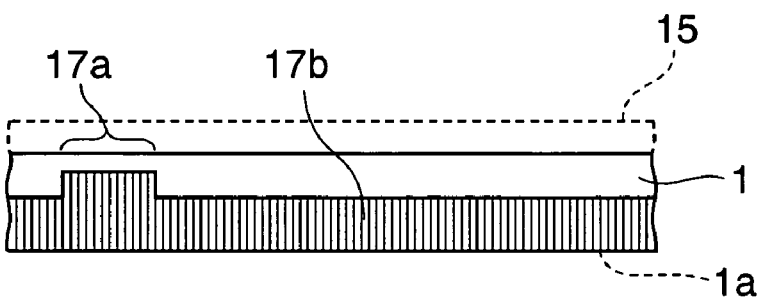
Figure 6C:
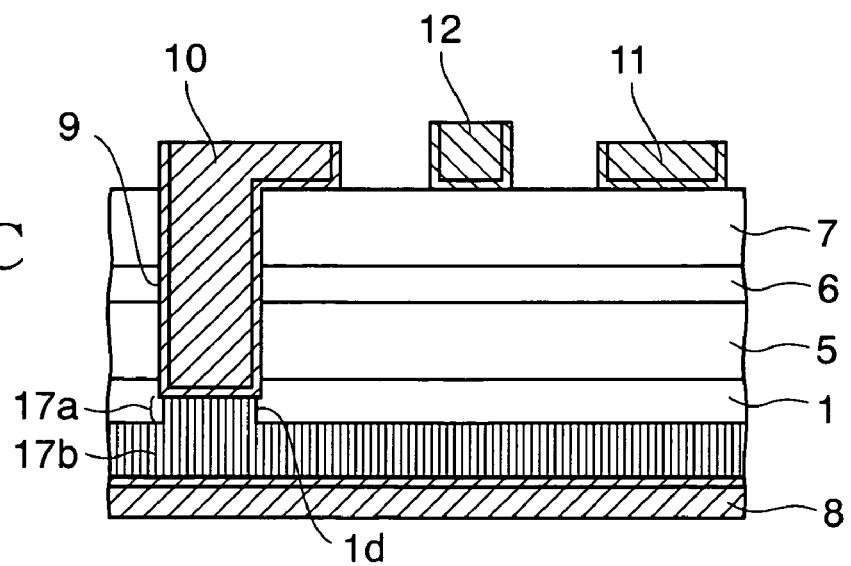

FIGS. 6A to 6C are cross-sectional views of a method of manufacturing a semiconductor device according to a third embodiment of the present invention. In these drawings, the same reference numerals will be used to the members already described in the first and second embodiments, and description thereof will be omitted below.

First, as shown in FIG. 6A, the first heat treatment described in the second embodiment is performed for the SiC substrate 1, and thus a first heat conductor 17a constructed from carbon nanotubes is formed in the surface 1a of the SiC substrate 1. Thereafter, a silicon nitride film is formed as the second mask film 15 to a thickness of 500 nm by a plasma CVD method and the like only on the other surface 1b of the SiC substrate 1.

Next, as shown in FIG. 6B, the second heat treatment described in the second embodiment is performed for the SiC substrate 1, and the carbon nanotubes are grown over the surface 1a of the SiC substrate 1, which is not covered with the second mask film 15, and the grown carbon nanotubes are used as a second heat conductor 17b. By this second heat treatment, the second mask film 15 is decomposed, and disappears finally.

Thereafter, the processes of FIGS. 1D to 1G, which have been described in the first embodiment, are performed, and a basic structure of a HEMT shown in FIG. 6C is completed. According to the above-described processes, a structure in which the first heat conductor 17a is formed in the hole 1d of the SiC substrate 1 and directly connected to the source electrode 10 in the hole 9 is obtained.

According to the present embodiment described above, the carbon nanotubes are grown over the surface 1a of the SiC substrate 1 by surface decomposition of SiC, and the grown carbon nanotubes are used as the second heat conductor 17b. Accordingly, heat generated in the HEMT can be radiated entirely from the surface 1a of the SiC substrate 1, and the heat radiation effect can be improved far more than those of the first and second embodiments.

Furthermore, the second heat conductor 17b is formed by growing the carbon nanotubes from the surface 1a of the SiC substrate 1 to the depth direction of the substrate 1. Accordingly, ultimate thickness of the SiC substrate 1 is thinned more than those of the first and second embodiments, and the heat becomes difficult to be accumulated in the SiC substrate 1, thus making it possible to bring about the characteristics of the HEMT sufficiently.

Fourth Embodiment

Next, a method of manufacturing a semiconductor device according to a fourth embodiment of the present invention will be described.

FIGS. 7A to 7I are cross-sectional views showing the method of manufacturing a semiconductor device according to this embodiment in order of processes.

Figure 7A:
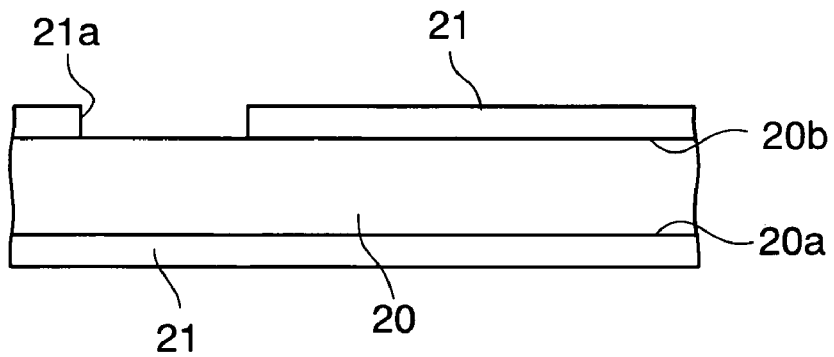
FIGS. 7A to 7I are cross-sectional views showing a method of manufacturing a semiconductor device according to a fourth embodiment of the present invention in order of processes.

First, a process until obtaining a cross-sectional structure shown in FIG. 7A will be described.

First, silicon nitride films are formed as a mask films 21 to a thickness of approximately 500 nm by a plasma CVD method and the like on a surface 20a and the other surface 20b of a SiC substrate 20 whose thickness is approximately 400 μm. Thereafter, a resist pattern (not shown) is formed on one of the mask films 21, and while using this resist pattern as a mask, the mask film 21 is etched by dry etching using the fluorine-based etching gas such as $SF_6$ gas, and a window 21a is formed in the mask film 21 on the surface 20b. Thereafter, the resist pattern is removed.

Figure 7B:
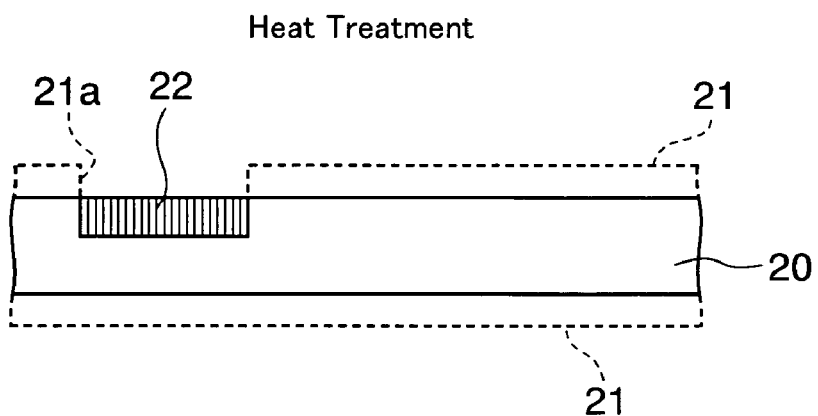

Subsequently, as shown in FIG. 7B, the SiC substrate is placed in the oxygen atmosphere or in the vacuum at the pressure of approximately $10^{-4}$ to $10^{-10}$ Torr, and a heat treatment for the SiC substrate 20 is started at the substrate temperature of 1200 to 2000° C., and preferably, 1500 to 1700° C. By this heat treatment, carbon nanotubes are grown by surface decomposition of SiC on the SiC substrate 20 exposed from the window 21a. Then, the above-described heat treatment is ended at a point where the carbon nanotubes have reached a depth of approximately 50 μm from the surface of the SiC substrate 20, and the above-described carbon nanotubes are used as a heat conductor 22. In the present embodiment, a time period for this heat treatment is set as several hours, for example, 10 hours.

Note that, in order to facilitate the carbon nanotubes to be oriented to the depth direction of the SiC substrate 20, it is preferable to use such a SiC substrate 20 whose surface 20b is an a-SiC(000-1) C plane.

Moreover, the mask films 21 made of the silicon nitride films are decomposed by this heat treatment, and disappear at the end of the heat treatment.

Figure 7C:
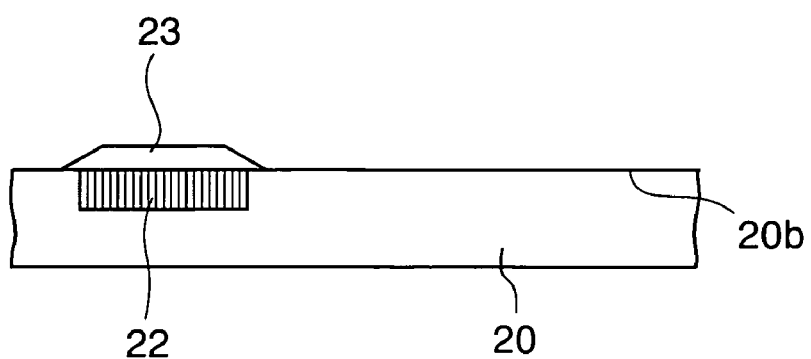

Next, a process until obtaining a cross-sectional structure shown in FIG. 7C will be described.

First, on respective upper surfaces of the heat conductor 22 and the SiC substrate 20, an AlN film is formed to a thickness of approximately 10 nm by a MOCVD method using TMAl and $NH_3$ as reaction gases. Subsequently, a resist pattern (not shown), having a planer shape that covers the heat conductor 22, is formed on this AlN film, and the AlN film is etched by use of this resist pattern as an etching mask, and a remaining AlN film after the etching is used as a protective film 23. For the etching of the AlN film, dry etching using the chlorine-based etching gas such as $BCl_3$ gas is employed.

Figure 7D:
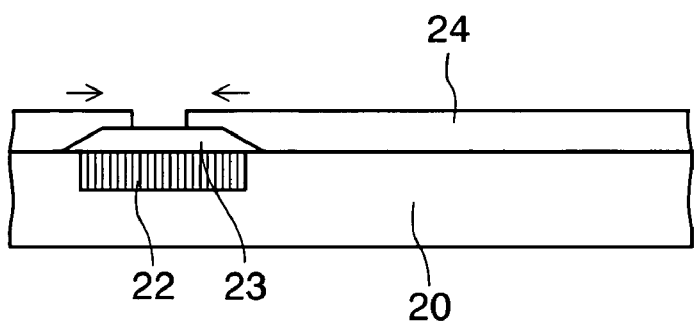

Subsequently, as shown in FIG. 7D, a GaN film is formed as a buffer layer 24 to a thickness of approximately 100 nm on the protective film 23 and the SiC substrate 20 by a MOCVD method of enhanced lateral overgrowth, in which TMGa and $NH_3$ are used as a Ga source and an N source respectively. In the MOCVD method of the enhanced lateral overgrowth, an mask (not shown) is provided above the SiC substrate 20, and the buffer layer 24 is grown epitaxially in the lateral direction on the SiC substrate below the mask, thus making it difficult for a lattice defect to occur in the buffer layer 24.

Next, a process until obtaining a cross-sectional structure shown in FIG. 7E will be described.

First, as a channel layer 25, an i-type GaN film with a thickness of approximately 3 μm is formed on the buffer layer 24 by a MOCVD method. In the MOCVD method, TMGa and $NH_3$ are used as a Ga source and an N source, respectively, and growth conditions where the growth pressure is 20 Torr and the substrate temperature is 1000° C. are employed.

Subsequently, i-type AlGaN is formed as a spacer layer 26 to a thickness of approximately 10 nm on the channel layer 25 by use of a MOCVD method using TMGa, $NH_3$ and TMAl as reaction gases under the conditions where the growth pressure is 20 Torr and the substrate temperature is 1000° C.

Furthermore, n-type AlGaN is formed as an electron supply layer 27 to a thickness of approximately 10 nm by MOCVD method. In this MOCVD method, a gas obtained by adding Si as an n-type impurity to the reaction gases used when forming the spacer layer 26 is used, and the growth conditions where the growth pressure is 20 Torr and the substrate temperature is 1000° C. is employed.

Figure 7E:
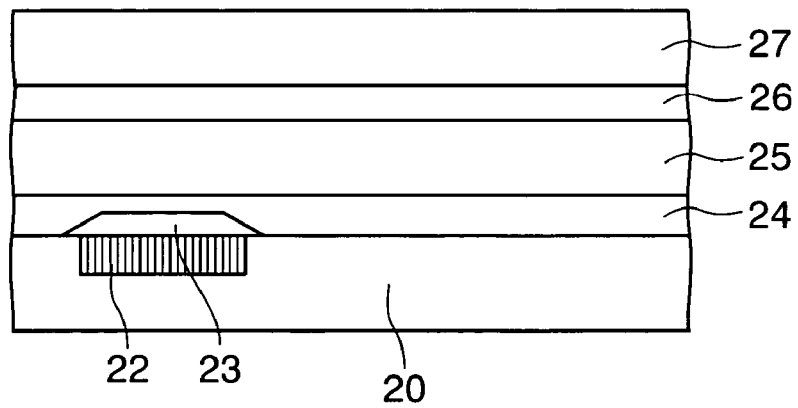
Figure 7F:
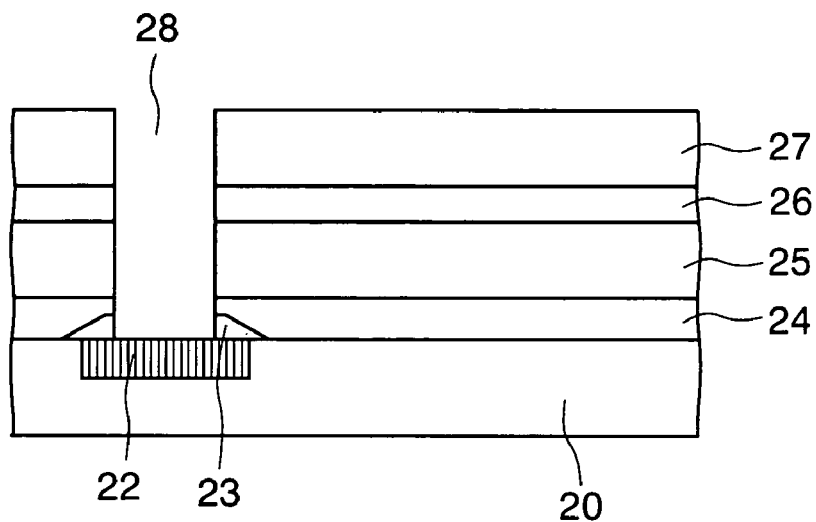

Subsequently, as shown in FIG. 7F, a resist pattern including a hole-shaped window (not shown) is formed on the electron supply layer 27, and while using this resist pattern as an etching mask, etching is performed from the electron supply layer 27 to the protective film 23 by plasma etching using the chlorine-based etching gas such as $BCl_3$ gas, thereby forming a hole 28 with a depth reaching the heat conductor 22. Thereafter, the resist pattern is removed.

Next, a process until obtaining a cross-sectional structure shown in FIG. 7G will be described.

First, a resist pattern including a window with a shape of a source electrode on the hole 28 and a window with a shape of a drain electrode spaced from the source electrode is formed on the electron supply layer 27. Then, a Ti layer with a thickness of 10 nm and an Au layer with a thickness of 300 nm are sequentially formed by a sputtering method on an upper surface of the resist pattern and in the windows. Thereafter, the resist pattern is removed, and thus this metal stack film is patterned by a lift-off method and left as a source electrode 29 and a drain electrode 30 on the electron supply layer 27. The source electrode 29 is directly connected to the heat conductor 22 at a bottom portion of the hole 28.

Subsequently, a gate electrode 31 constructed by forming a Pt layer with a thickness of 10 nm and an Au layer with a thickness of 300 nm in this order is formed by an evaporation method and a lift-off method.

Figure 7G:
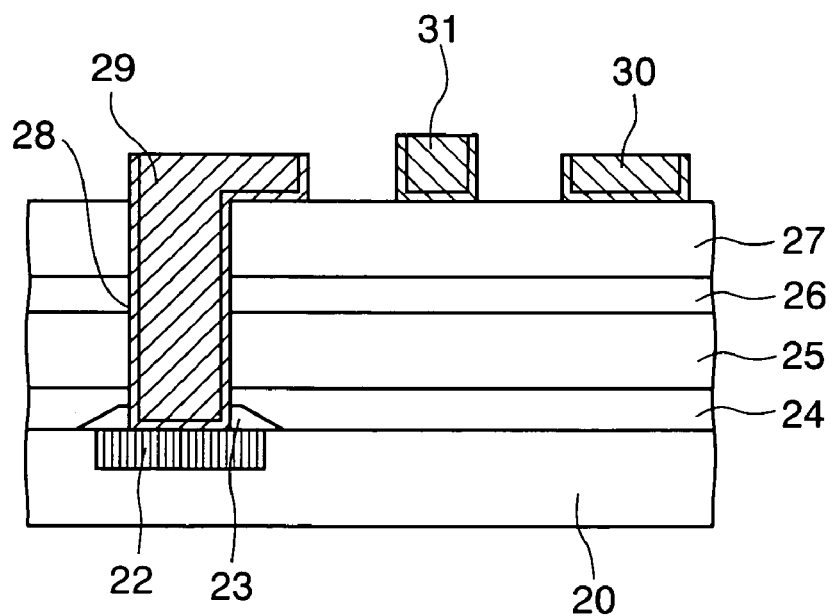
Figure 7H:
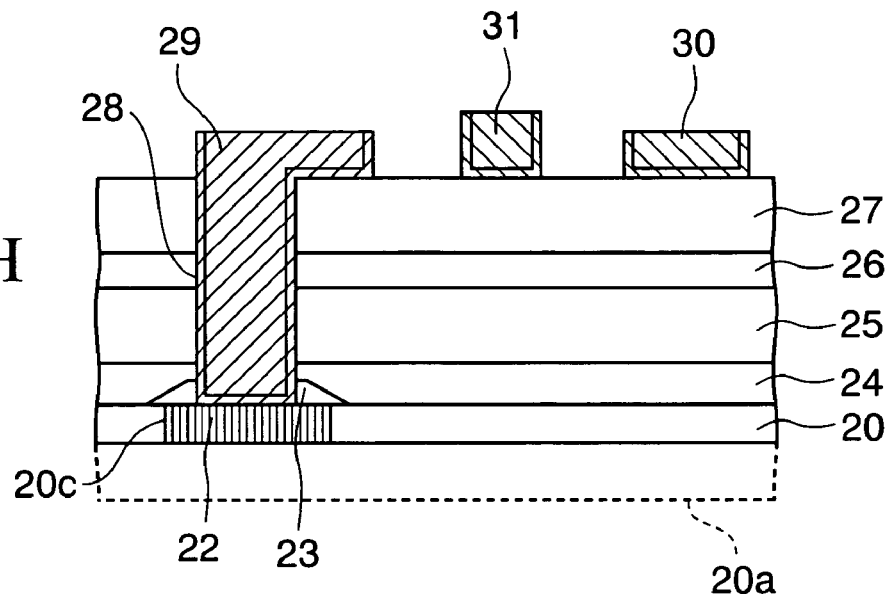

Subsequently, as shown in FIG. 7H, chemical mechanical polishing (CMP) is performed from the surface 20a of the SiC substrate 20 by use of slurry made of diamond particles whose diameter is approximately 30 μm, and thus a thickness of the SiC substrate 20 is thinned to approximately 30 to 200 μm, and the surface of the heat conductor 22 is exposed into a hole 20c of the SiC substrate 20. By this process, a structure in which the heat conductor 22 is formed in the hole 20c of the SiC substrate 20 is obtained.

Figure 7I:
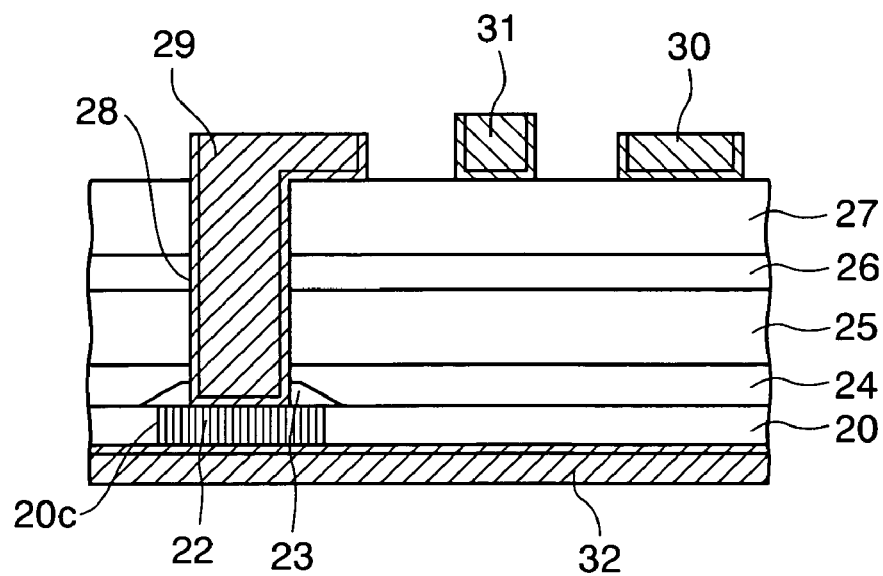

Finally, as shown in FIG. 7I, a Ti layer with a thickness of 10 nm and an Au layer with a thickness of 500 nm are formed in this order by a sputtering method on the back surface of the SiC substrate 20 and the surface of the heat conductor 22, and a ground electrode 32 constructed from these conductive films is formed. This ground electrode 32 is formed on the entire back surface of the SiC substrate 20, and electrically connected to the heat conductor 22.

By these steps, a basic structure of the HEMT according to this embodiment is completed.

According to the present embodiment descried above, the heat conductor 22 made of the carbon nanotubes is formed by the surface decomposition of SiC as in the first embodiment. Accordingly, it is not necessary to previously form a hole of the SiC substrate 1. Therefore, in comparison with the case of previously forming the hole and forming the heat conductor 22 therein later, simplification of the process can be achieved, and the heat conductor can be formed easily.

Furthermore, when exposing the heat conductor 22 by the CMP in the process of FIG. 7H, the thickness of the SiC substrate 20 is thinned. Accordingly, a connection distance between the ground electrode 32 and the source electrode 29 can be shortened. Consequently, in comparison with the case where the SiC substrate 20 is not thinned, a transmission loss can be reduced to a higher frequency range, and a high-quality HEMT can be provided.

Moreover, by thinning the SiC substrate 20, it becomes difficult for heat generated in the HEMT to be accumulated in the SiC substrate 20, and the heat radiation effect can be enhanced. Then, even when three-dimensional packaging is performed by stacking chips such as in Chip on Chip (CoC), a thickness of the device after the packaging is not heightened because the thickness of the SiC substrate 20 is thin, thus making it possible to contribute to miniaturization of an electronic apparatus.

In addition, the protective film 23 is formed on the heat conductor 22. Accordingly, when forming the semiconductor layer such as the buffer layer 24, the carbon nanotubes constituting the heat conductor 22 can be prevented from being deteriorated, and impurities can be prevented from being mixed from the carbon nanotubes to the buffer layer 24.

Although the AlN layer is formed as the protective film 23, a lattice constant of AlN is 3.110 Å, which is a value between a lattice constant (3.086 Å) of the SiC substrate 1 and a lattice constant (3.189 Å) of GaN constituting the buffer layer 24. Accordingly, a mismatch in lattice constant between the buffer layer 24 and the protective film 23 is reduced. Hence, it becomes difficult for a lattice defect to occur in the buffer layer 24 on the protective film 23, and a highly reliable HEMT can be provided.

Furthermore, as shown in FIG. 7D, the buffer layer 24 is deposited by the enhanced lateral overgrowth. Accordingly, the high-quality buffer layer 24 in which the lattice defect is reduced can be formed on the SiC substrate 20 and the protective film 23, which have the lattice constants different from each other.

Fifth Embodiment

Next, a method for manufacturing a semiconductor device according to a fifth embodiment of the present invention will be described.

FIGS. 8A to 8K are cross-sectional views showing the method of manufacturing a semiconductor device according to the present embodiment in order of processes.

Figure 8A:
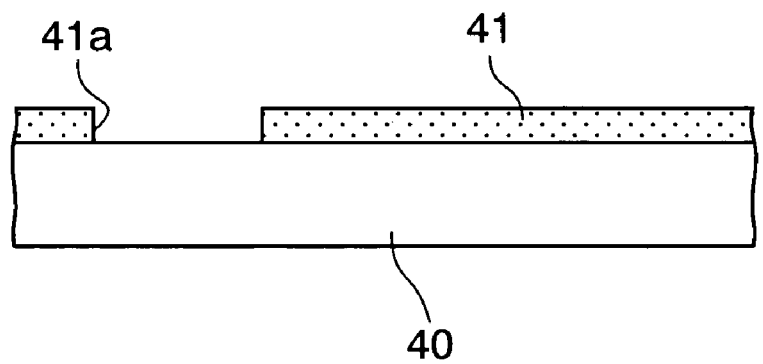
FIGS. 8A to 8K are cross-sectional views showing a method of manufacturing a semiconductor device according to a fifth embodiment of the present invention in order of processes.

First, as shown in FIG. 8A, photoresist is coated on a silicon substrate 40, and then exposed and developed, and thus a resist pattern including a window 41a is formed. Note that, in place of the silicon substrate 40, a GaAs substrate and a sapphire substrate may be used.

Figure 8B:
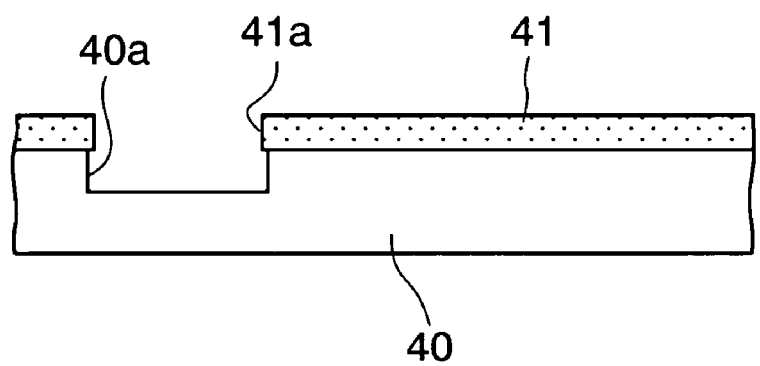

Next, as shown in FIG. 8B, the silicon substrate 40 is loaded into an etching chamber (not shown) of inductively coupled plasma (ICP) etching, and while using the resist pattern 41 as an etching mask, the silicon substrate 40 is etched by high density plasma etching using $SF_6$ as an etching gas, and a hole 40a with a depth of 50 μm or more is formed.

Note that the hole 40a may be formed by wet etching.

Figure 8C:
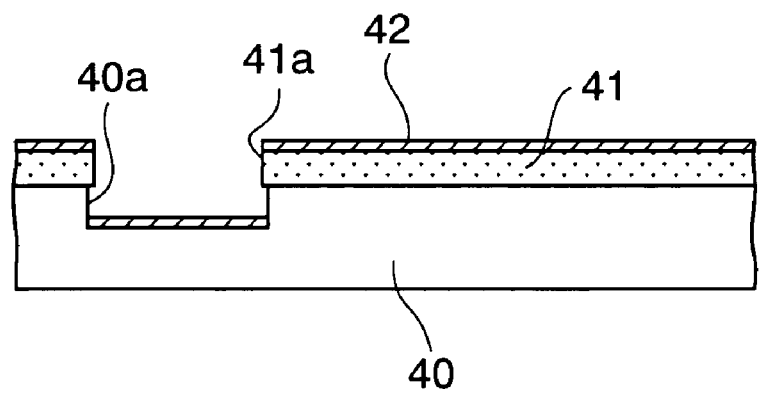

Subsequently, as shown in FIG. 8C, a nickel (Ni) film is formed as a catalyst layer 42 to a thickness of approximately 10 nm by a sputtering method on a bottom surface of the hole 40a and the resist pattern 41. Note that, in place of the sputtering method, the catalyst layer 42 may be formed by an evaporation method, a laser ablation method, a plating method and the like. Furthermore, the catalyst layer 42 may be formed by coating a solution made by dispersing fine metal particles into a solvent over the bottom surface of the hole 40a and the resist pattern 41. Moreover, the metal constituting the catalyst layer 42 is not limited to Ni, but iron (Fe), cobalt (Co) and an alloy thereof may be used.

Figure 8D:
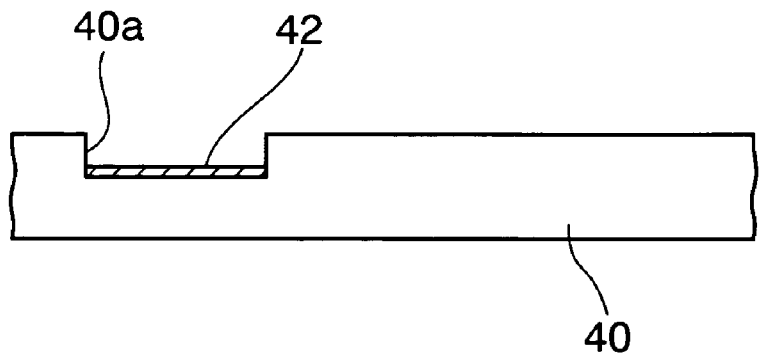

Subsequently, as shown in FIG. 8D, the resist pattern 41 is removed, and the catalyst layer 42 is left only on the bottom portion of the hole 40a.

Figure 8E:
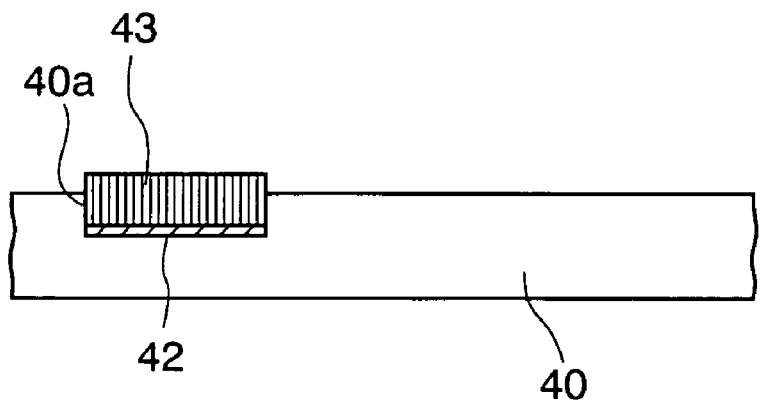

Next, a process until obtaining a cross sectional structure shown in FIG. 8E will be described.

First, the silicon substrate 40 is loaded into a vacuum chamber (not shown), and as reaction gases for a thermal CVD method, gas mixture of acetylene and hydrogen are introduced into the vacuum chamber at flow rates of 80 sccm and 20 sccm, respectively. Then, a pressure in the vacuum chamber is maintained at 200 Pa, and a substrate temperature is maintained at 900° C. According to this, a bundle of carbon nanotubes 43 oriented to the depth direction of the silicon substrate 30 grows selectively only on the catalyst layer 42. Then, the introduction of the reaction gases is stopped when a tip of the bundle of carbon nanotubes 43 grows higher than the surface of the silicon substrate 40, and the silicon substrate 40 is unloaded from the vacuum chamber.

Note that a growth method of the bundle of carbon nanotubes 43 is not limited to this. For example, the carbon nanotubes may be grown by a thermal filament CVD method of performing gas dissociation by use of a thermal filament. In this case, for example, as the reaction gases, gas mixture of acetylene and hydrogen are introduced into the vacuum chamber at the flow rates of 80 sccm and 20 sccm, respectively, and the pressure is set at 1000 Pa in the vacuum chamber, the substrate temperature is set at 600° C., and a thermal filament temperature is set at 1800° C. Moreover, a DC plasma-thermal filament CVD method, in which direct current (DC) plasma and the thermal filament are combined, may be employed. In this case, for example, as the reaction gases, gas mixture of acetylene and hydrogen are introduced into the vacuum chamber at the flow rates of 80 sccm and 20 sccm, respectively, and in the vacuum chamber, the pressure is et at 1000 Pa, the substrate temperature is set at 600° C., and the thermal filament temperature is set at 1800° C.

Figure 8F:
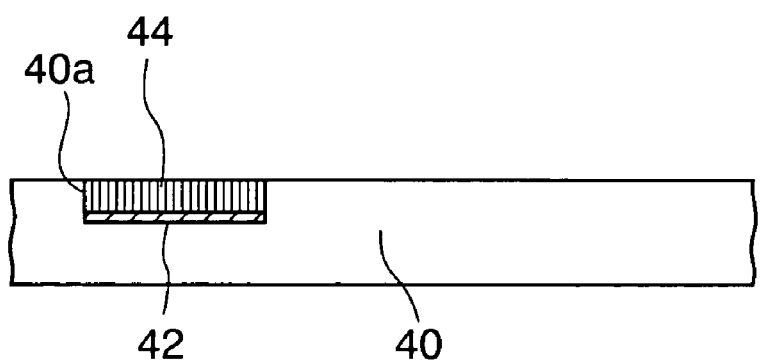

Then, as shown in FIG. 8F, the bundle of carbon nanotubes 43 projecting above the surface of the silicon substrate 40 is polished by a CMP method, and the bundle of carbon nanotubes 43 is left only in the hole 40a as a heat conductor 44. In this CMP, for example, slurry made of diamond particles whose diameter is approximately 30 μm is used.

Note that it is also conceivable that the bundle of carbon nanotubes 43 is grown such that the tip thereof coincides with the surface of the silicon substrate 40 without performing the CMP in a manner described above. However, according to this, it is difficult to precisely control the growth of the bundle of carbon nanotubes 43. Accordingly, it is preferable to align the bundle of carbon nanotubes 43 with the surface of the silicon substrate by the planarization by use of the CMP.

Moreover, in place of the CMP, the tip of the bundle of carbon nanotubes 43 may be removed by using an argon ion milling method in which Ar ions are made obliquely incident onto the surface of the silicon substrate 40.

Figure 8G:
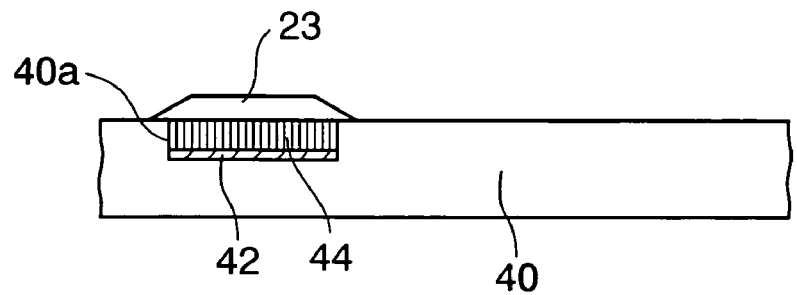

Next, a process until obtaining across-sectional structure shown in FIG. 8G will be described.

An AlN film is formed to a thickness of approximately 10 nm on respective upper surfaces of the heat conductor 44 and the silicon substrate 40 by a MOCVD method using TMAl and $NH_3$ as reaction gases. Subsequently, a resist pattern (not shown), having a plane shape of covering the heat conductor 44, is formed on this AlN film, and the AlN film is etched by use of the resist pattern as an etching mask, and a remaining AlN film after the etching is used as the protective film 23. For the etching of the AlN film, dry etching using the chlorine-based etching gas such as $BCl_3$ gas is employed.

Figure 8H:
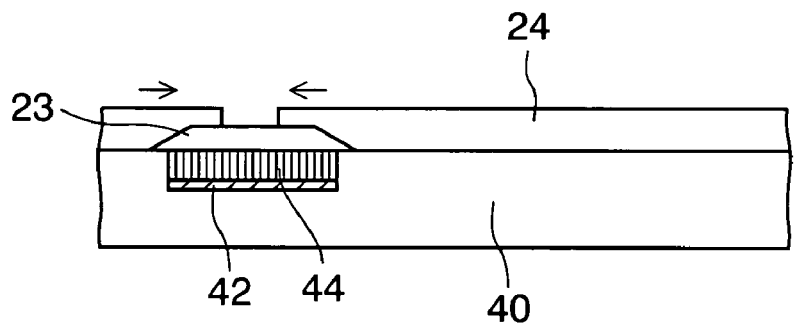

Subsequently, as shown in FIG. 8H, a GaN film is formed a buffer layer 24 to a thickness of approximately 100 nm on the protective film 23 and the silicon substrate 40 by the MOCVD method of the enhanced lateral overgrowth, in which TMGa and $NH_3$ are used as a Ga source and an N source, respectively.

Figure 8I:
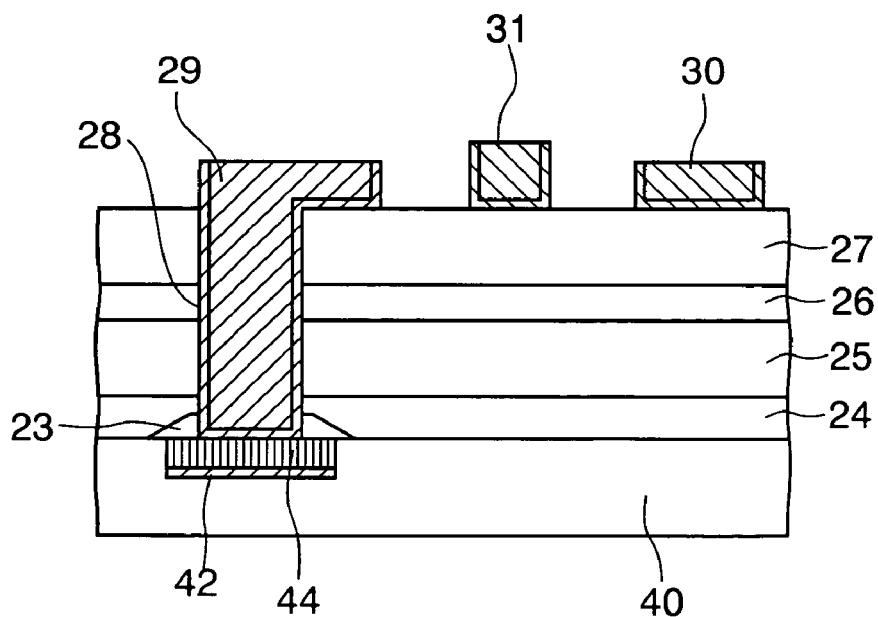

Thereafter, the processes of FIGS. 7E to 7G, which have been described in the fourth embodiment, are performed. Thus, a cross-sectional structure shown in FIG. 8I is obtained.

Figure 8J:
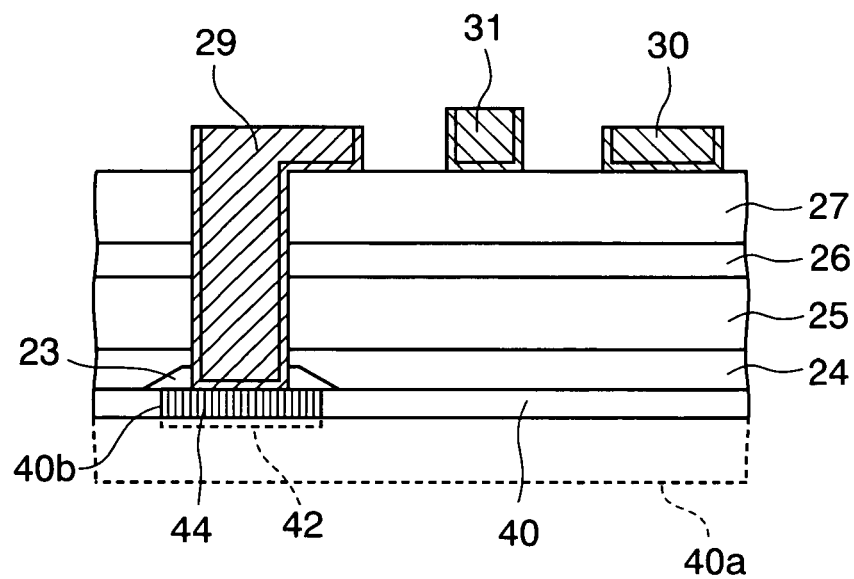

Next, as shown in FIG. 8J, CMP is performed from the surface 40a of the silicon substrate 40 by use of slurry made of diamond whose diameter is approximately 30 μm, and thus a thickness of the silicon substrate 40 is thinned to approximately 30 to 200 μm, for example, to approximately 50 μm, and the surface of the heat conductor 44 is exposed to the back surface of the silicon substrate 40. Note that, in the case of using a GaAs substrate and a sapphire substrate in place of the silicon substrate 40, it is preferable to thin a thickness of the substrate to approximately 30 μm by this CMP.

By this process, a structure in which the heat conductor 44 is formed in a hole 40b of the silicon substrate 40 is obtained.

Figure 8K:
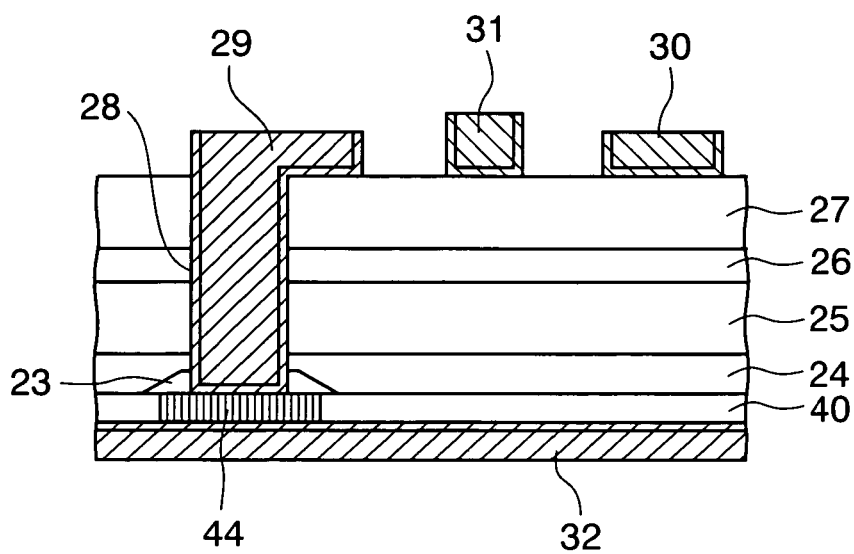

Finally, as shown in FIG. 8K, a Ti layer with a thickness of 10 nm and an Au layer with a thickness of 500 nm are formed in this order as a ground electrode 32 by a sputtering method on the back surface of the silicon substrate 40 and the exposed surface of the heat conductor 44. This ground electrode 32 is formed over the back surface of the silicon substrate 40, and electrically connected to the heat conductor 44.

According to the above steps, a basic structure of the HEMT according to the present embodiment is completed.

According to the present embodiment described above, the thickness of the silicon substrate 40 is thinned to approximately 30 to 200 μm by the CMP in the process of FIG. 8J. Accordingly, for reasons similar to those in the fourth embodiment, the transmission loss can be reduced to a higher frequency range in comparison with the case where the silicon substrate 40 is not thinned, and the HEMT, which is high quality, can be provided.

Furthermore, by thinning the thickness of the silicon substrate 40, such advantages can be obtained, as in that heat generated in the HEMT becomes difficult to be accumulated in the silicon substrate 40, thus making it possible to enhance the heat radiation effect, and that the thickness of the device is not heightened when three-dimensional packaging is performed, thus making it possible to contribute to the miniaturization of the electronic apparatus.

Then, the heat conductor 44 constructed from the carbon nanotubes is formed by the CVD method before forming the HEMT on the silicon substrate 40. Accordingly, the respective semiconductor layers 25 to 27 constituting the HEMT are not damaged by the heat in the CVD, and the reliability of the HEMT can be enhanced.

Moreover, similarly to the fourth embodiment, AlN having a lattice constant (3.110 Å) of a value between a lattice constant (5.43 Å) of the silicon substrate 40 and a lattice constant (3.189 Å) of the buffer layer 24 made of GaN is employed as the protective film 23. Accordingly, the lattice defect due to a mismatch among the lattice constants becomes difficult to occur. Furthermore, the lattice constant (3.110 Å) of AlN constituting the protective film 23 is proximate to the lattice constant (3.189 Å) of GaN constituting the buffer layer 24. Accordingly, the lattice defect becomes further difficult to enter the buffer layer 24.

In addition, the heat conductor 44 is formed before fabricating the semiconductor device such as the HEMT on the silicon substrate 40. Accordingly, the HEMT can be prevented from being damaged by the heat when growing the carbon nanotubes by the CVD method.

Another Embodiment

Figure 9:
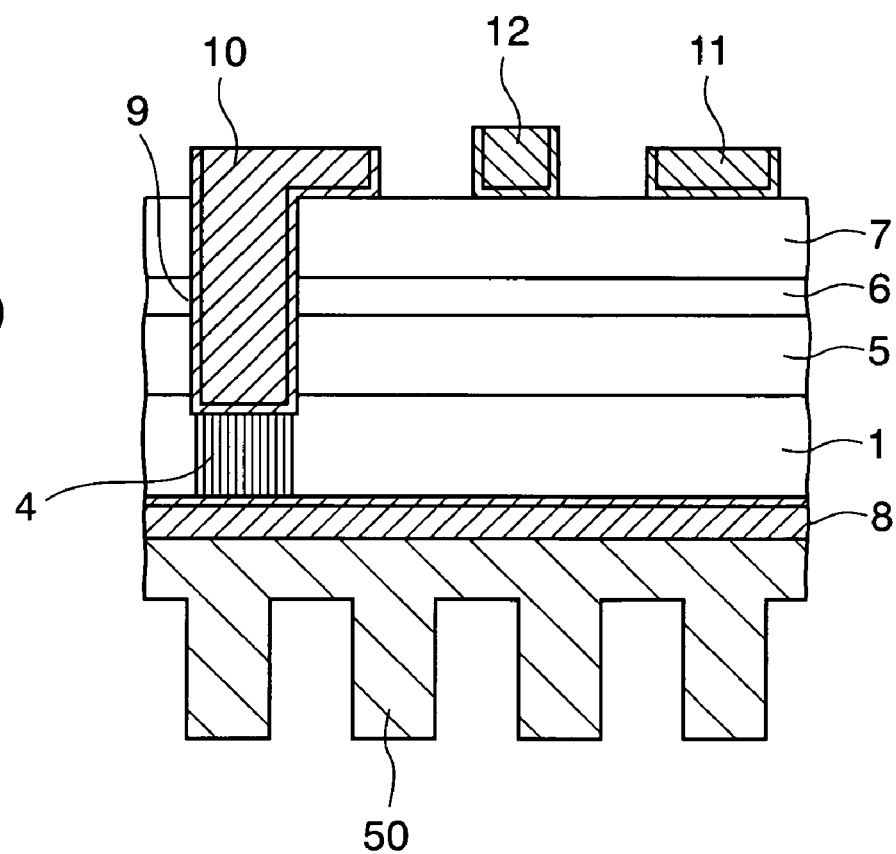
FIG. 9 is a cross-sectional view of a semiconductor device according to another embodiment of the present invention.

In the respective embodiments described above, a heatsink (radiation plate) may be provided in order to further enhance the heat radiation effect. As shown in FIG. 9, a heatsink 50 is made of, for example, aluminum whose cross section has concavity and convexity. In the first to third embodiments, the heatsink 50 is formed on the ground electrode 8 by adhesive (not shown) and the like. Moreover, in the fourth and fifth embodiments, the heatsink 50 may be provided on the ground electrode 32.

What is claimed is:
1. A semiconductor device comprising:
    a SiC substrate; and
    a heat conductor formed in a first hole in the SiC substrate and made of bundle of carbon nanotubes oriented in a depth direction of the first hole;
    a film formed on the SiC substrate;
    a second hole formed in the film, the second hole being located on the heat conductor; and
    an electrode formed in the second hole and directly connected to the heat conductor;
    wherein a diameter of the heat conductor is the same as a diameter of the first hole.

2. The semiconductor device according to claim 1, wherein the electrode is a metal stack film whose lower most layer is a titanium layer.

3. The semiconductor device according to claim 1, wherein, on an entire surface of the SiC substrate opposite to the film, a conductive film electrically connected to the electrode is formed.

4. The semiconductor device according to claim 1, wherein a protective film is formed between the SiC substrate and the film.

5. The semiconductor device according to claim 4, wherein a lattice constant of the protective film is a value between lattice constants of the SiC substrate and the film.

6. A semiconductor device comprising:
- a SiC substrate having a lower surface and an upper surface, the lower surface being opposite to the upper surface;
- a first heat conductor formed in a first hole in the lower surface of the SiC substrate and made of a bundle of carbon nanotubes;
- a second heat conductor formed in a second hole in the lower surface of the SiC substrate to be spaced from the first hole at interval, the second heat conductor being made of a bundle of carbon nanotubes oriented in a depth direction of the second hole; and
- an element formed on the upper surface of the SiC substrate;
- wherein a diameter of the first heat conductor is the same as a diameter of the first hole, and a diameter of the second heat conductor is the same as a diameter of the second hole,
- wherein the element is an HEMT, and at least a part of the second heat conductor is located between a gate electrode and a drain electrode of the HEMT when viewed from above the SiC substrate.

7. The semiconductor device according to claim 6, wherein a distance from the upper surface of the SiC substrate to an upper surface of the second heat conductor is longer than a distance from the upper surface of the SiC substrate to an upper surface of the first heat conductor.

8. A semiconductor device comprising:
- a SiC substrate having a lower surface and an upper surface, the lower surface being opposite to the upper surface;
- a first heat conductor formed in a hole in the SiC substrate and made of bundle of carbon nanotubes oriented in a depth direction of the first hole;
- a second heat conductor formed to cover the lower surface of the SiC substrate entirely and made of bundle of carbon nanotubes oriented in a depth direction of the first hole; and
- an element formed on the upper surface of the SiC substrate;
- wherein a diameter of the first heat conductor is the same as a diameter of the hole.

* * * * *